United States Patent
Weber

(10) Patent No.: US 6,852,628 B2
(45) Date of Patent: Feb. 8, 2005

(54) METHOD OF INSULATING INTERCONNECTS, AND MEMORY CELL ARRAY WITH INSULATED INTERCONNECTS

(75) Inventor: Detlef Weber, Hermsdorf (DE)

(73) Assignee: Infineon Technologies AG, Munich (DE)

( * ) Notice: Subject to any disclaimer, the term of this patent is extended or adjusted under 35 U.S.C. 154(b) by 30 days.

(21) Appl. No.: 10/247,576

(22) Filed: Sep. 19, 2002

(65) Prior Publication Data

US 2003/0058708 A1 Mar. 27, 2003

(30) Foreign Application Priority Data

Sep. 19, 2001 (DE) .......................... 101 46 146

(51) Int. Cl.[7] .............................................. H01L 21/44
(52) U.S. Cl. ...................... 438/688; 438/253; 438/396
(58) Field of Search ................................ 438/253, 680, 438/681, 712, 721, 722, 723, 724, 725, 733, 734, 756, 757, 770, 775, 396, 954, 688, 691, 738

(56) References Cited

U.S. PATENT DOCUMENTS

| | | | |
|---|---|---|---|
| 5,260,600 A | * 11/1993 | Harada | ........................ 257/639 |
| 5,362,686 A | * 11/1994 | Harada | ........................ 438/238 |
| 5,693,566 A | 12/1997 | Cheung | |
| 5,858,547 A | 1/1999 | Drage | |
| 6,015,457 A | 1/2000 | Leung et al. | |
| 6,124,165 A | * 9/2000 | Lien | ........................ 438/253 |
| 6,171,945 B1 | 1/2001 | Mandal et al. | |
| 6,291,628 B1 | 9/2001 | Chen et al. | |
| 6,300,252 B1 | * 10/2001 | Ying et al. | ................... 438/723 |
| 6,525,398 B1 | * 2/2003 | Kim et al. | ................... 257/529 |
| 2001/0005609 A1 | 6/2001 | Lee | |

FOREIGN PATENT DOCUMENTS

| | | |
|---|---|---|
| EP | 0 680 085 A1 | 11/1995 |
| EP | 0 551 306 B1 | 12/1995 |
| WO | WO 00/51174 | 8/2000 |

OTHER PUBLICATIONS

A. Chin et al.: "Device and reliability of high–Al203 gate dielectric with good mobility and low D_it", *1999 Symposium on VLSI Technology, Digest of Technical Papers*, Kyoto, Japan, Jun. 14–16, 1999, Japan Soc Appl Phys 1999, pp. 135–136.

S. McClatchie et al.: "CVD low–k for gap fill & planarisation", *European Semiconductor*, Aug. 1999, pp. 32–33.

V. Kottler et al.: An in situ X–ray photoelectron spectroscopy study of AlO/sub x/ spin tunnel barrier formation. *Journal of Applied Physics. Mar. 15, 2001. vol. 89. No. 6, pp. 3301–3306.*

* cited by examiner

*Primary Examiner*—David Nhu
(74) *Attorney, Agent, or Firm*—Laurence A. Greenberg; Werner H. Stemer; Gregory L. Mayback

(57) ABSTRACT

The process is used to electrically insulate adjacent metallic interconnects made from an aluminum-containing alloy, in particular for interconnects which are arranged on a DRAM cell array. A dielectric material is applied to the interconnects and the polymerizable material polymerizes under the action of heat. In a heat-treatment step the dielectric material is polymerized. A step of applying the dielectric material is carried out without a step of applying an interlayer between interconnects and dielectric material. On account of the self-passivation effect of aluminum, a thin $Al_2O_3$ film, which protects the interconnect from corrosion, is formed on the interconnects.

8 Claims, 2 Drawing Sheets

METHOD OF INSULATING INTERCONNECTS, AND MEMORY CELL ARRAY WITH INSULATED INTERCONNECTS

BACKGROUND OF THE INVENTION

Field of the Invention

The present invention relates to a method for electrically insulating adjacent metallic interconnects which have been formed from an aluminum-containing alloy layer, in particular by an etching process, and to a method for electrically insulating adjacent metallic interconnects on an array of dynamic random access memories (DRAMs). In addition, the invention relates to a memory cell array having a multiplicity of DRAM memory cells which are formed next to one another on a semiconductor substrate and have metallic interconnects arranged on them.

DRAM memory cells can be produced as single-transistor memory cells. They comprise a read transistor and a storage capacitor. The information is stored in the storage capacitor in the form of an electric charge which represents a logic 0 or a logic 1. Driving the read transistor via a word line allows this information to be read via a bit line.

Therefore, a plurality of metallization levels are generally arranged above the actual memory cell, allowing the functions of the memory cell to be fulfilled. In particular so-called embedded DRAM memory cell arrays, i.e. DRAM memory cell arrays which are integrated on a chip together with application-specific logic and processing components, have one or more metallization levels above the DRAM memory cell array.

Due to the fact that the storage density increases from memory generation to memory generation, the surface area required by the single-transistor memory cell has to be reduced from generation to generation.

It is also necessary for the lateral distance between adjacent interconnects to be reduced. To reduce the associated capacitive coupling between adjacent interconnects, it has become necessary on the one hand to reduce the resistance of the interconnects, for example by using an AlCu alloy, and on the other hand to use so-called low-k dielectrics as insulating material between the interconnects of a metallization level, that is to say dielectrics with a dielectric constant of less than 4.

To ensure that a dielectric is suitable for integration in a subtractive AlCu metallization, in which first of all an AlCu alloy is applied to the entire surface, and then interconnects are defined and etched in photolithographic processing, it is necessary for the dielectric to have what are known as gap-fill properties, so that void-free filling and therefore good insulation is ensured, in particular between the metal tracks.

Dielectrics which have gap-fill properties of this type are usually able to flow and harden in a plasma or furnace process during which the polymerization process takes place. During the plasma or furnace process, which in each case typically takes place at a temperature of approximately 400° C., water is generally released in gas form by outgassing, and this may have an adverse effect first on the metal tracks and secondly also on the active areas of the DRAM cell below, or also on other semiconductor components. Hitherto, it has been assumed that the gaseous water which is released leads to corrosion to metal tracks and increases the resistance of the metal tracks, with the result that the reliability of the metal tracks and therefore of the semiconductor component is impaired.

For this reason, it has been deemed necessary for a thin film of, for example $SiO_2$ or $Si_3N_4$ to be provided as moisture barrier directly above the metal tracks.

FIG. 3 shows an example of a cross section through a metallization structure 2 which is arranged on an $SiO_2$ layer 1 and on which there is a dielectric layer 3 comprising a material with a low dielectric constant. An $SiO_2$ layer 5 is provided as moisture barrier. Furthermore, there is an $SiO_2$ layer 4 on the dielectric layer 3.

By way of example, S. McClatchie, K. Beekman and A. Kiermasz, in "CVD low-k for gap fill & planarisation" EUROPEAN SEMICONDUCTOR, August 1999, p. 32–33, discuss the need for an interlayer as a moisture barrier for layers below.

Likewise, U.S. Pat. No. 5,693,566 states that an $SiO_2$ is required on the metal tracks in order to protect the devices from moisture. The $SiO_2$ layer is deposited by a separate CVD step.

The need to use an interlayer of this type, associated problems and possible solutions to these problems are also discussed in particular in U.S. Pat. No. 6,171,945.

Specifically, a moisture barrier interlayer of this type, which usually consists of $SiO_2$ or $Si_3N_4$, has the associated problem that this interlayer generally has a higher dielectric constant than the surrounding dielectric layer, with the result that the capacitive coupling is in turn increased. On the other hand, it is also difficult to further reduce the feature sizes if an additional interlayer has to be applied between interconnects and insulating material.

SUMMARY OF THE INVENTION

It is accordingly an object of the invention to provide an improved method for electrically insulating adjacent metallic interconnects and a memory cell array having a multiplicity of adjacent metallic interconnects which overcome the above-mentioned disadvantages of the heretofore-known devices and methods of this general type and which are particularly suitable for electrically insulating adjacent metallic interconnects of a DRAM cell array and which provide an improved such DRAM device.

With the foregoing and other objects in view there is provided, in accordance with the invention, a method of electrically insulating interconnects, which comprises the following steps:

providing a semiconductor wafer having a substrate;
 forming mutually adjacent metallic interconnects, comprising an aluminum-containing alloy, on the substrate;
 subsequently exposing the semiconductor wafer to an oxidizing atmosphere after the metallic interconnects have been formed;
 subsequently applying a heat-polymerizable dielectric material to the metallic interconnects; and
 increasing and holding a temperature of the semiconductor wafer to thereby polymerize the dielectric material.

In other words, the objects of the invention are achieved by a method for electrically insulating interconnects that comprises the following steps:

forming adjacent metallic interconnects, which comprise an aluminum-containing alloy, on the substrate;
 applying a dielectric material, which is polymerized under the action of heat, to the interconnects;
 increasing and holding the temperature of the semiconductor wafer, so that the dielectric material is polymerized;

the semiconductor wafer being exposed to an oxidizing atmosphere after the metallic interconnects have been formed and before the dielectric material is applied.

The present invention can be employed in particular for the fabrication of an electrical insulation between adjacent metallic interconnects which run on or above a DRAM memory cell array.

With the above and other objects in view there is also provided, in accordance with the invention, a memory cell array having a multiplicity of memory cells which are formed next to one another in or on a semiconductor substrate and are electrically insulated from one another by an insulating material, each of the memory cells comprising a storage capacitor and a select transistor, and having a multiplicity of metallic interconnects which lie next to one another, are arranged on the memory cell array, contain aluminum and are electrically insulated from one another by a dielectric polymerized material, the metallic interconnects being at least partially separated from the memory cell array by at least one insulation layer, in which memory cell array the dielectric material adjoins an $Al_2O_3$ layer, which has been formed as a result of passivation effects, on the metallic interconnects.

As has been discovered in the present invention, it is, surprisingly, possible to dispense with depositing the moisture barrier interlayer directly on the metallic interconnects comprising an aluminum-containing alloy even if the dielectric layer for electrical insulation is subjected to a heat treatment in order to polymerize the dielectric material.

This is because it has emerged that, on the one hand, the metallic interconnects made from an aluminum-containing alloy are not attacked by the water escaping in gas form during the polymerization step. This can be explained by the self-passivation effect of aluminum. By way of example, after the interconnects have been formed, the wafer is removed from the corresponding processing installation, with the result that the interconnects are exposed to the ambient atmosphere. In the process, the aluminum reacts with oxygen, and a thin, passivating aluminum oxide film is formed on the surface of the interconnects. Therefore, there is no need for dedicated deposition of a moisture barrier layer after the formation of the interconnects and before application of the dielectric material.

This effect can optionally be reinforced if the wafer together with the patterned metallic interconnects is subjected to an additional passivation treatment, for example in an oxygen plasma, in order, for example, for the semiconductor wafer also to be cleaned after the formation of the metallic interconnects.

If, furthermore, the metallic interconnects are arranged, for example, on a DRAM cell array or another semiconductor device, the active areas are protected either by an insulation layer which is additionally applied beneath the metallization layer or by an interlayer as is customarily used. By way of example, an insulation layer which acts as a moisture barrier, for example comprising $SiO_2$, $Si_3N_4$, SiON, BSG, PSG or BPSG, may additionally be deposited, at least partially over the active areas, before the metallization layer is deposited. In this context, the term "at least partially" preferably means over the entire surface with the exception of contact openings leading to structures below.

Moreover, in DRAM cells, insulation layers or interlayers at least partially separate the active areas from the metallization levels, and these layers generally comprise $SiO_2$, $Si_3N_4$, SiON, BSG, (borosilicate glass), PSG (phosphorsilicate glass) or BPSG (borophosphosilicate glass). Therefore, these layers can also act as a moisture barrier.

Polymerizable materials which in particular release water as they are polymerized are usually used as dielectric materials to insulate the interconnects from one another. It is preferable for them to be able to flow, i.e. to have good gap-fill properties, as a result of which they fill the spaces between adjacent interconnects without any voids after heating.

Examples of dielectric materials include standard low-k materials, such as substantially carbon-doped silicon dioxide (SiCOH), for example low-k Flowfill produced by Trikon Technologies, Inc., and also organic or inorganic spin-on glasses (SOGs). However, it is also possible to use dielectric materials which do not belong to the low-k materials, for example organic or inorganic spin-on glasses with relatively high dielectric constants. In this case too, it is possible to achieve the advantageous effects of the present invention, namely that the feature size can be reduced without problems.

In the heat treatment step, the semiconductor wafer is brought to a temperature and is held at this temperature for a sufficient time for polymerization or cross linking of the dielectric material to take place. Temperatures of up to approximately 400° C. are generally employed for this purpose.

The material used for the interconnects is an aluminum-containing alloy, i.e. in particular an AlCu alloy with a copper content of approximately 0.5 to 2 percent by weight (% by weight), preferably 0.5 to 1% by weight. However, it is also possible to use another aluminum-containing alloy.

Overall, therefore, the present invention achieves at least the following benefits:

the fact that it is possible to dispense with the interlayer which serves as a moisture barrier means that the feature size of the metallization and of semiconductor device with metallization can be reduced further without problems. Furthermore, the complexity of the fabrication method and the costs are reduced.

if a dielectric with a low dielectric constant is used as the dielectric, the effective dielectric constant is not increased by the introduction of the interlayer with a high dielectric constant. As a result, the capacitive coupling between adjacent interconnects is reduced, with the result that the performance of the device is increased.

Other features which are considered as characteristic for the invention are set forth in the appended claims.

Although the invention is illustrated and described herein as embodied in a method for insulating interconnects, and a memory cell array having insulated interconnects, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
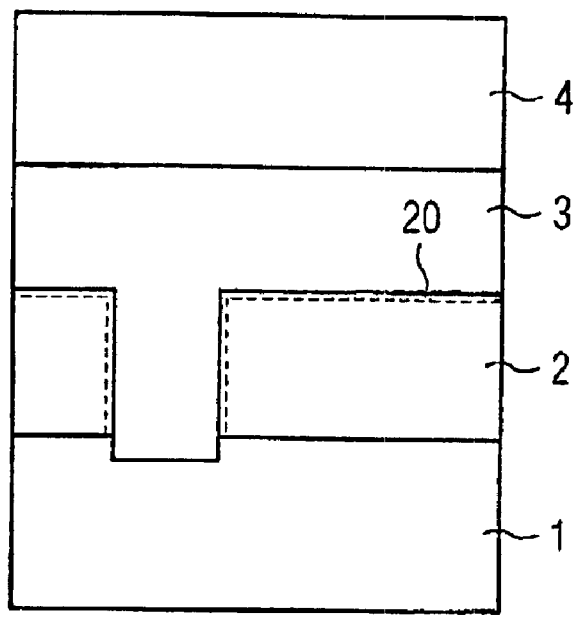
FIG. 1 is a diagrammatic view of metallic interconnects which are insulated from one another by a dielectric with a low dielectric constant using the method according to the invention.
Figure 3:
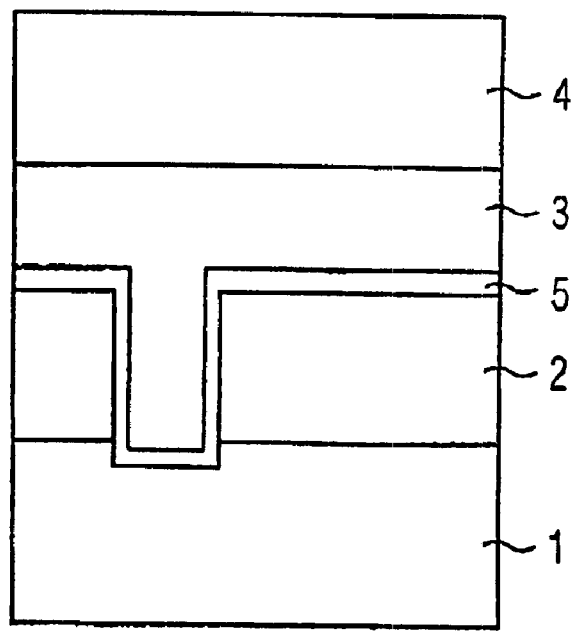
FIG. 3 is a diagrammatic view of metallic interconnects which are insulated from one another in accordance with the prior art by a dielectric with a low dielectric constant.

Referring now to the figures of the drawing in detail and first, particularly, to FIG. 1 thereof, there is shown an assembly of layers that is based on a semiconductor wafer. The figure illustrates an $SiO_2$ layer 1 which has been applied to a semiconductor substrate and on which a metallization structure 2 is to be formed. By way of example, the $SiO_2$ layer 1 may be arranged above the active areas of a semiconductor configuration or above a lower metallization level of a semiconductor configuration.

To form the metallization structure 2, first of all a titanium layer as bonding agent and an AlCu alloy layer with a copper content of 0.5% by weight are applied over the entire surface, typically with a thickness of 300 to 450 nm. To etch the interconnects 2, the alloy layer is firstly covered with an approximately 100 to 300 nm hard-mask material comprising $SiO_2$, SiON or a combination thereof and with a photoresist material. The photoresist material is photolithographically patterned in accordance with the interconnects which are to be produced, using a mask. Then, firstly the hard mask is etched in a plasma etching process using $CF_4/CHF_3$ as etching gas. After the residual photoresist material has been removed, the method according to the invention for etching the metal layer system is carried out.

For this purpose, the aluminum-containing alloy layer is etched by a reactive ion etching process using an etching gas mixture comprising $BCl_3/Cl_2/CH_4/N_2$. If appropriate, a cleaning step then takes place in an oxygen plasma, in order to remove residues of photoresist. A step of passivating the surfaces of the interconnects may also take place.

Then, the wafer is removed from the etching installation and the inventive method for electrically insulating the interconnects which have been produced is carried out. The residues of the hard mask thereby remain on the interconnects.

As a result of the removal of the wafer, the interconnects pass into ambient air and are immediately passivated by the formation of a thin film of $Al_2O_3$ 20. In addition, the semiconductor wafer which bears the structures may be exposed to a treatment with an oxygen plasma, which is usually carried out in order to clean the semiconductor wafer. The passivation layer is reinforced during this plasma treatment.

To electrically insulate the interconnects which have been produced, first of all a dielectric material 3 is applied. By way of example, it is possible to apply a so-called low-k flowfill material produced by Trikon Technologies, Inc., as described in S. McClatchie et al., European Semiconductor, August 1999, pp. 32–33, i.e. a film based on silicon dioxide with a dielectric constant of approximately 2.7, using a CVD process. Then, the semiconductor substrate is subjected to a heat treatment at approximately 400° C., with the result that polymerization and flow of the dielectric material take place, so that the spaces between the metal tracks are filled.

The electrical insulation of the metal tracks is then concluded. If appropriate, depending on the process sequence, an $SiO_2$ layer may additionally be deposited on the surface of the dielectric layer.

Figure 2:
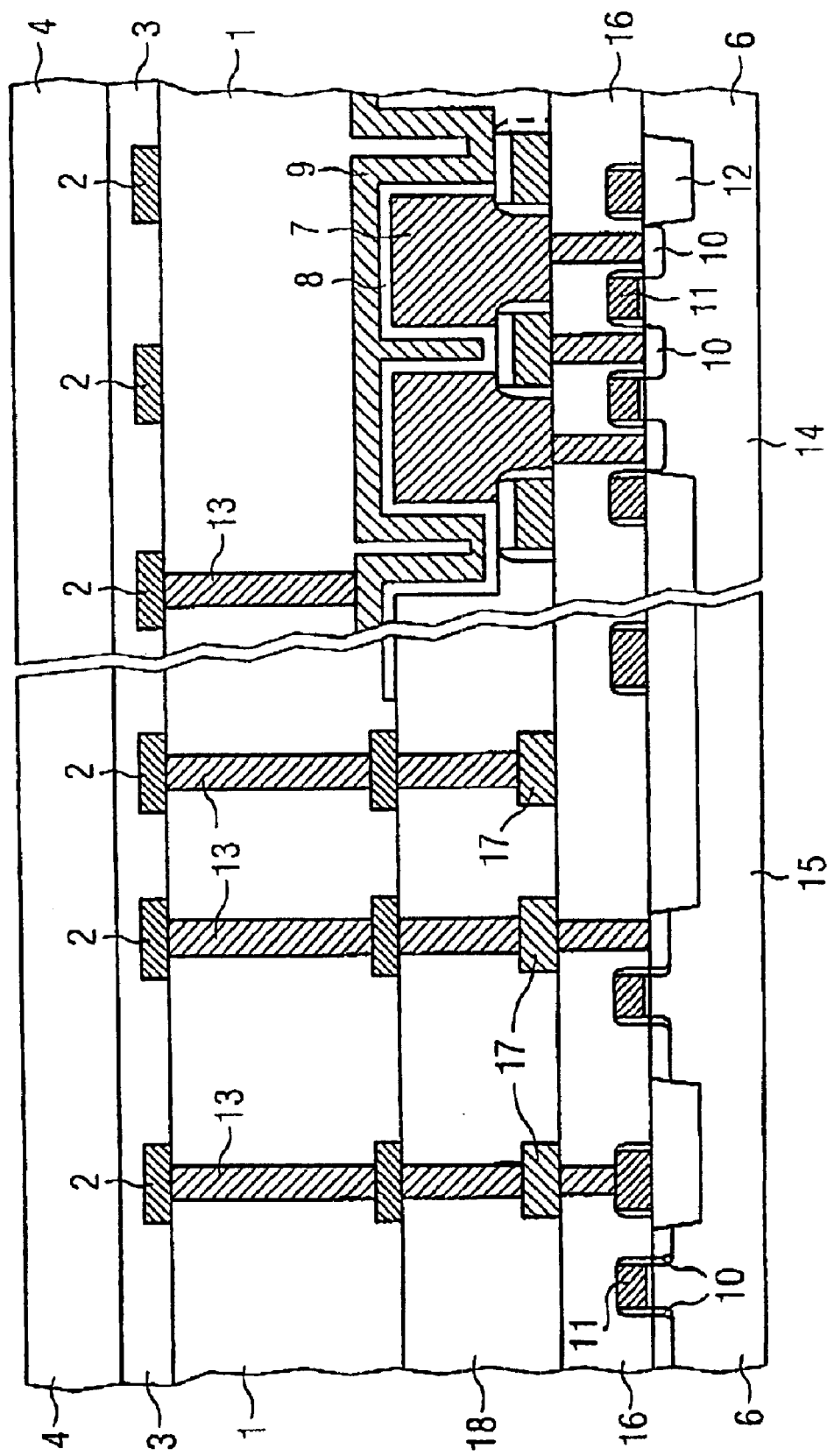
FIG. 2 is a diagrammatic cross section through an embedded DRAM configuration in accordance with an exemplary embodiment of the present invention.

FIG. 2 illustrates a second exemplary embodiment of the present invention, in which the metallic interconnects are arranged on an embedded DRAM cell array.

In FIG. 2, reference 14 denotes the memory region and 15 denotes the logic region of an embedded DRAM arrangement. In the memory region 14, source and drain electrode 10 and gate electrode 11 of a select transistor are arranged on a semiconductor substrate 6. Adjacent memory cells are insulated from one another by insulation regions 12. In the present instance, the storage capacitor is designed as a stacked capacitor and comprises a lower capacitor electrode 7, for example made from tungsten, a capacitor dielectric 8, for example comprising a silicon dioxide/silicon nitride/silicon dioxide layer stack (ONO), and an upper capacitor electrode 9 comprising a material which is customarily used. A further insulating layer 1, for example comprising $SiO_2$, is arranged above the capacitance layer. Interconnects 2 made from an AlCu alloy have been formed from this insulating layer 1 by means of a reactive ion etching process as described above. The interconnects 2 are connected to the DRAM cell below through contact holes 13 which have been filled with an electrically conductive material.

For insulation purposes, a flowable dielectric layer 3, for example low-k Flowfill produced by Trikon Technologies, is then applied. Then, the temperature is increased to approx. 400° C. and held at this temperature, so that the low-k dielectric is cured. Finally, an $SiO_2$ layer 4 is applied as covering layer.

Once again, the metallic interconnects are protected from water which escapes in gas form on account of the self-passivating effect of aluminum. The fact that the $SiO_2$ layer 1 is arranged between the dielectric layer 3 and the upper capacitor electrode 9 and therefore acts as a moisture barrier also prevents the capacitor from being adversely affected by water escaping in gas form.

The metallization structure may also be used on a DRAM cell arrangement with trench capacitors. In this case, the $SiO_2$ layer 16 would act as a moisture barrier. While in stacked capacitor memory cells the storage capacitor is formed on the semiconductor substrate, in trench capacitors (trench capacitor memory cell), by contrast, the capacitor is formed in a trench arranged in the semiconductor substrate.

The insulation between the interconnects 2 takes place in the same way in the logic region 15 of the embedded DRAM arrangement. Furthermore, the interconnects 17 have likewise been formed by a reactive ion etching process from an AlCu alloy layer. The dielectric layer 18 is applied without a moisture barrier, as described above. The $SiO_2$ layer 16 protects the device components below from moisture, and the AlCu interconnects are protected from moisture on account of the self-passivation effect of aluminum. The fact that the contact holes 19 are only formed after the polymerization and are filled with electrically conductive material means that there are no adverse effects for the contacts.

Therefore, the present invention makes it possible to insulate metallic interconnects comprising an aluminum-containing alloy without a moisture barrier from one another by means of a polymerizable dielectric material, even if water escapes in gas form during the polymerization process. In this way, the fabrication method can be simplified further, the size of the device as a whole can easily be reduced, and an undesirable increase in the dielectric constant is avoided.

I claim:

1. A method of electrically insulating interconnects, which comprises the following steps:

providing a semiconductor wafer having a substrate;
forming mutually adjacent metallic interconnects, comprising an aluminum-containing alloy, on the substrate;

subsequently exposing the semiconductor wafer to an oxidizing atmosphere after the metallic interconnects have been formed;

subsequently applying a heat-polymerizable dielectric material to the metallic interconnects; and increasing and holding a temperature of the semiconductor wafer to thereby polymerize the dielectric material.

2. The method according to claim 1, wherein the polymerized dielectric material has a dielectric constant of less than 4.

3. The method according to claim 1, which further comprises applying an $SiO_2$ layer after the step of increasing and holding the temperature for heating the substrate.

4. The method according to claim 1, wherein the dielectric material is chosen to be flowable on exposure to heat.

5. The method according to claim 1, wherein the dielectric material releases water upon being polymerized.

6. The method according to claim 1, wherein, subsequently to the formation of the metallic interconnects, the dielectric material is applied without a moisture barrier layer previously having been deposited.

7. The method according to claim 1, which comprises exposing the semiconductor wafer to ambient air after the formation of the metallic interconnects.

8. The method according to claim 1, which comprises treating the semiconductor wafer with an oxygen plasma after the formation of the metallic interconnects.

* * * * *